United States Patent [19]

Hashimoto

[11] Patent Number: 4,941,127

[45] Date of Patent: Jul. 10, 1990

[54] METHOD FOR OPERATING SEMICONDUCTOR MEMORY SYSTEM IN THE STORAGE AND READOUT OF VIDEO SIGNAL DATA

[75] Inventor: Masashi Hashimoto, Garland, Tex.

[73] Assignee: Texas Instruments Inc., Dallas, Tex.

[21] Appl. No.: 158,173

[22] Filed: Feb. 19, 1988

[30] Foreign Application Priority Data

Feb. 20, 1987 [JP] Japan .................................. 62-38630
Aug. 19, 1987 [JP] Japan ................................. 62-205385

[51] Int. Cl.⁵ ............................................. G11C 11/26
[52] U.S. Cl. .................. 365/189.01; 365/193
[58] Field of Search .................. 365/189.01, 193, 191, 365/230.01, 244

[56] References Cited

U.S. PATENT DOCUMENTS 4,648,076  3/1987  Schrenk .......................... 365/189.01

*Primary Examiner*—Terrell W. Fears
*Attorney, Agent, or Firm*—William E. Hiller; N. Rhys Merrett; Mel Sharp

[57] ABSTRACT

A method of employing a semiconductor memory system in the storage and readout of video signal data, wherein first and second FIFO memories are utilized in a tandem manner to perform video-related operations in a plurality of functional modes, such as a flicker free mode, picture-in-picture mode, teletext mode, multi-picture mode, stroboscopic mode and still picture mode.

2 Claims, 16 Drawing Sheets

METHOD FOR OPERATING SEMICONDUCTOR MEMORY SYSTEM IN THE STORAGE AND READOUT OF VIDEO SIGNAL DATA

BACKGROUND OF THE INVENTION

1. Field of the Invention

The present invention relates to a method of employing a semiconductor memory system in the storage and readout of video signal data, and more particularly to a technique utilizing first and second FIFO memories of the memory system in a tandem manner to perform various video-related operations in a plurality of function modes.

2. Description of the Prior Art

With semiconductor memories having been manufactured at lower prices and with the development of digital processing techniques with respect to video signals, home TVs, VTRs and appliances with built-in semiconductor controls operated with digital signals are becoming available. Video signals as input into a TV and a VTR, with special regard to the image display (consisting of a Brown tube and a cathode electronic gun), must be generated sequentially and at proper time intervals in accordance with a standardized system. RAM's (DRAM and SRAM) which are memory structures developed for electronic computers are characterized by being directly accessible and directly addressable, thus having a higher freedom of flexibility in the access and use of stored information. As used in video signal processing, however, it is necessary to direct an address for every bit of data to be stored or readout from such memory structures.

On the other hand, a FIFO memory (First-In First-Out Memory) type is favorable for removing such a defect in the storage and access of data bits requiring individual addresses for each bit, where the first data item deposited in a queue of data items is to be the first one reached in processing. So far however no FIFO memory having a sufficiently large storage capacity and operating at the high speed necessary for a TV display has been available. A digital type CCD memory to some extent is acceptable for this purpose of sequiential storage and access of data, but it is generally not possible to use a CCD memory in a high speed operation or to perform simultaneous readout and writing of information with respect to, with the result being a restricted memory system of limited versatility.

In general, one approach toward adapting a RAM to video signal processing has taken the form of adding a circuit to a DRAM or an image processing-suited VRAM for controlling the address and refresh functions such that functions similar to those of a FIFO memory can be performed. The RAM function proper of the memory structure alone, during video signal processing, has not permitted the memory system to operate as other than a RAM, thus requiring a composite memory construction with the combined functions of a RAM and a FIFO memory, accompanied by an increase in the number of circuit elements. Such a composite memory structure also has difficulties as to reliability and would be more expensive as well. Because of these factors, the development of graphics-dedicated memory with the intention of reducing the functional burden of peripheral circuits, did not evolve as a complete FIFO memory device, but instead as a memory device designed for a particular purpose. This type of memory development is disadvantageous because the development of a special-purpose memory does not permit as much freedom in design as would be desirable.

OBJECTS AND SUMMARY OF THE INVENTION

An object of the present invention is to provide a method of employing a semiconductor memory system comprising FIFO memories operating in a tandem manner and being capable of performing various video-related functions.

The method of operating a semiconductor memory system according to the invention is characterized by employing a plurality of FIFO memories of the same large storage capacity in a tandem manner and thus providing the capability of realizing multiple functional modes.

The above-mentioned term "multiple functional modes" includes mainly those under the following items (1) through (3) which are requirements for realizing a multi-functional digital TV set, and additionally those functions under the following items (4) though (6).

(1) Flicker-free mode where flicker noise (periods: 1/30 second for the NTSC system and 1/25 second for PAL system) is removed from the TV screen.

(2) Picture-in-picture mode where a subpicture or subpictures are inserted in the main picture.

(3) Teletext mode where a much larger quantity of data words including several hundreds pages of teletext information are stored to permit reproduction of full pages with reduced page access time.

(4) Multi-picture mode which is a modified picture-in-picture mode where other information of a different channel is written sequentially on a TV screen.

(5) Stroboscopic-picture mode where under the preceding (4), images of the same channel are sequentially written at time intervals.

(6) Still mode.

The above-mentioned functions are not new per se. However, it is a new aspect in accordance with this invention these functions may be realized with the same FIFO memories of a semiconductor memory system. It is also clear that VTR-related or special effects such as a noise-free still picture, a noise-free search mode, or solarization could be readily realized.

In this case, a selective signal G such as Ⓜ or Ⓟ can be suitably set by known means.

Other objects, features and advantages of the invention will appear more fully from the following detailed description thereof, when taken in connection with the accompanying drawings.

BRIEF DESCRIPTION OF THE DRAWINGS

The drawings show illustrative embodiments of the present invention.

DESCRIPTION OF THE PREFERRED EMBODIMENTS

An embodiment of the invention will be described in detail with reference to the accompanying drawings hereinafter:

(1) Realization of flicker free mode

As well-known, frame repetition rate is 30 per second on TV display screen as in NTSC system, and flicker can be detected by human eye particularly higher light levels. The flicker effect is said substantially negligible when 60 views of the picture are presented each second. Usually therefore the so-called interlaced scanning technique is used that each frame is divided into two parts or fields so that 60 views of the scene are presented to the eye during each second.

Figure 1:
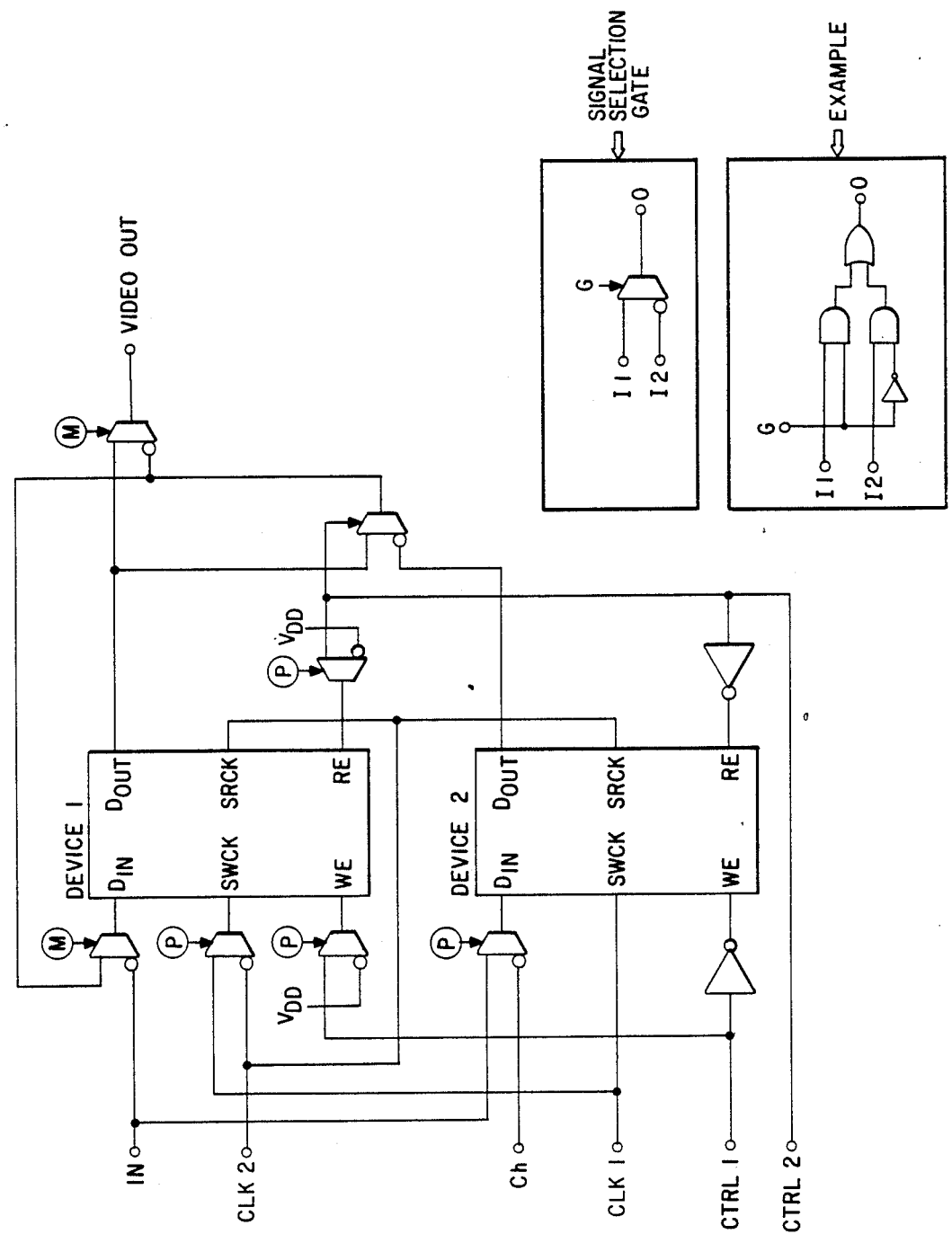
FIG. 1 is a block diagram of the principal circuit permitting realization of the above-mentioned functional modes.
Figure 2A:
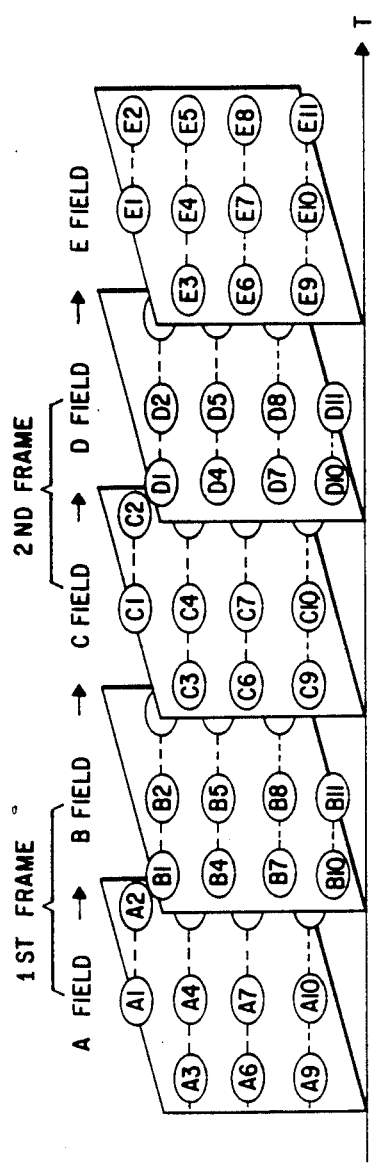
FIGS. 2A and 2B are a schematically-illustrated comparative diagram of the TV image signal transmission procedures and for the illustration of flicker-free mode.
Figure 2B:
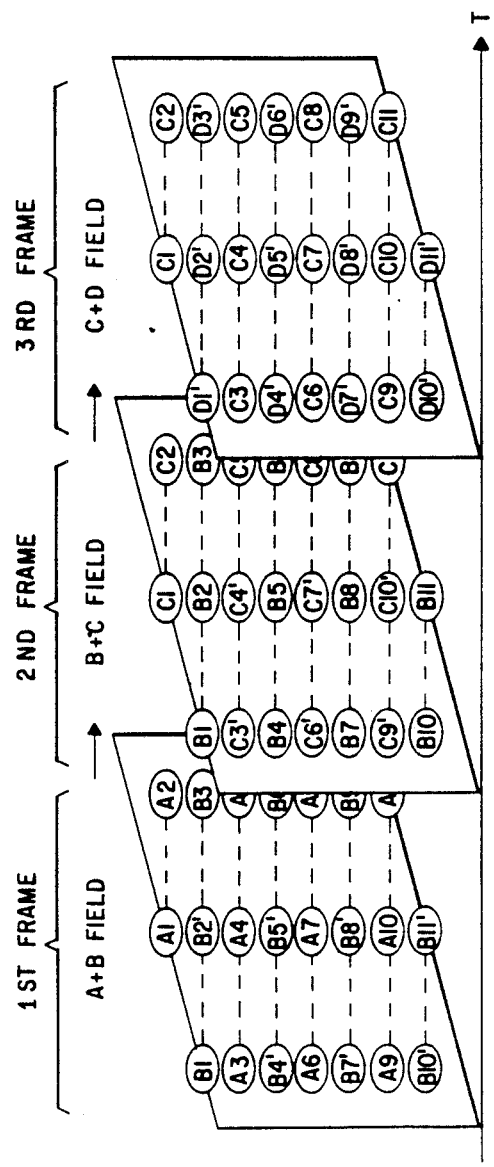

In this present embodiment of the present invention is adopted a functional relation between fields technique, known per se, to duplicate views of the picture, which will be described under for easier understanding of the present invention:

As for the interlaced scanning technique, as shown in FIG. 2A, each frame consists of two fields or groups interlacing horizontal scanning lines, thus field transmission frequency is 60 Hz. The first transmitted field designated by "A" and the second transmitted field designated by "B" (Similar designation is used for subsequent fields) constitute one complete frame. Simple addition of Fields "A" and "B" gives the video of a stationary subject in the form of natural appearance whereas a moving subject may be viewed as cross-color picture on the screen because of, for instance, a time interval of about 1/60 second between "A1" and "B2". In the present embodiment, "B2" is output not as it is but as "B2'" having a functional relation: $B2' = \alpha B2 + (1-\alpha)A1$, where $0 < \alpha < 1$. In such way, frames shown in FIG. 2B are constructed, which is the so-called functionally-related fields procedure to present flicker-free video images. The invention is not limited to this procedure and may be replaced by simpler procedure.

Figure 3:
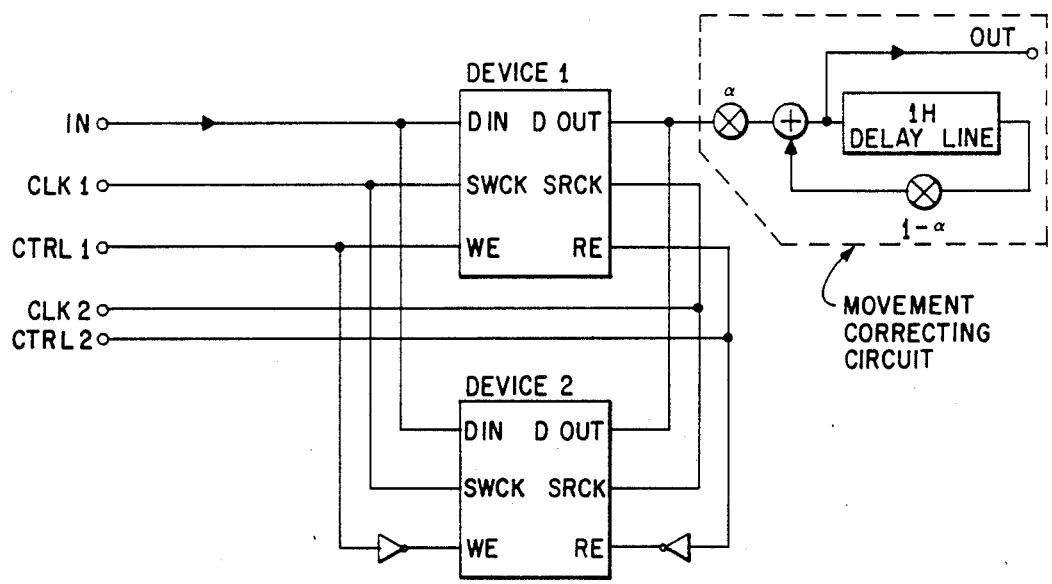
FIG. 3 is a block diagram of flicker-free image producing circuit comprising a FIFO memory.
Figure 4:
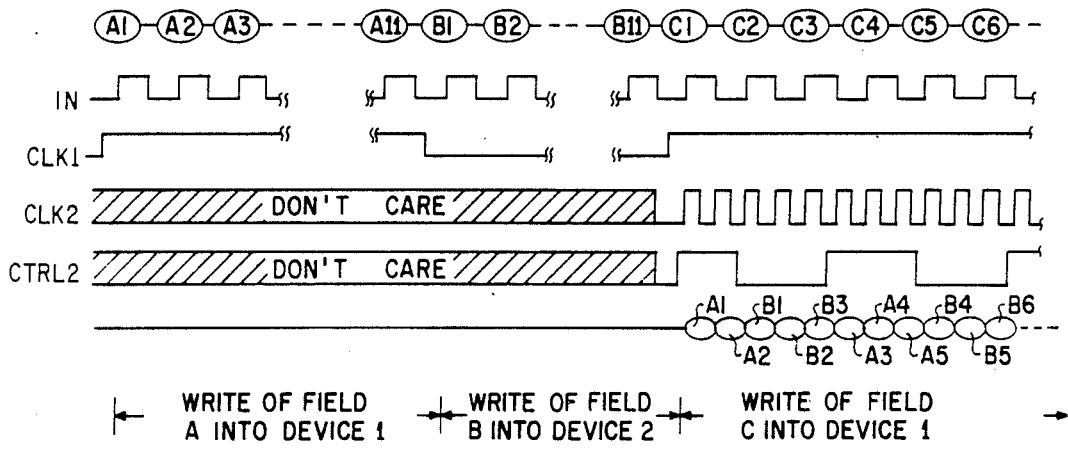
FIG. 4 is a timing chart of the circuit of FIG. 3.
Figure 16:
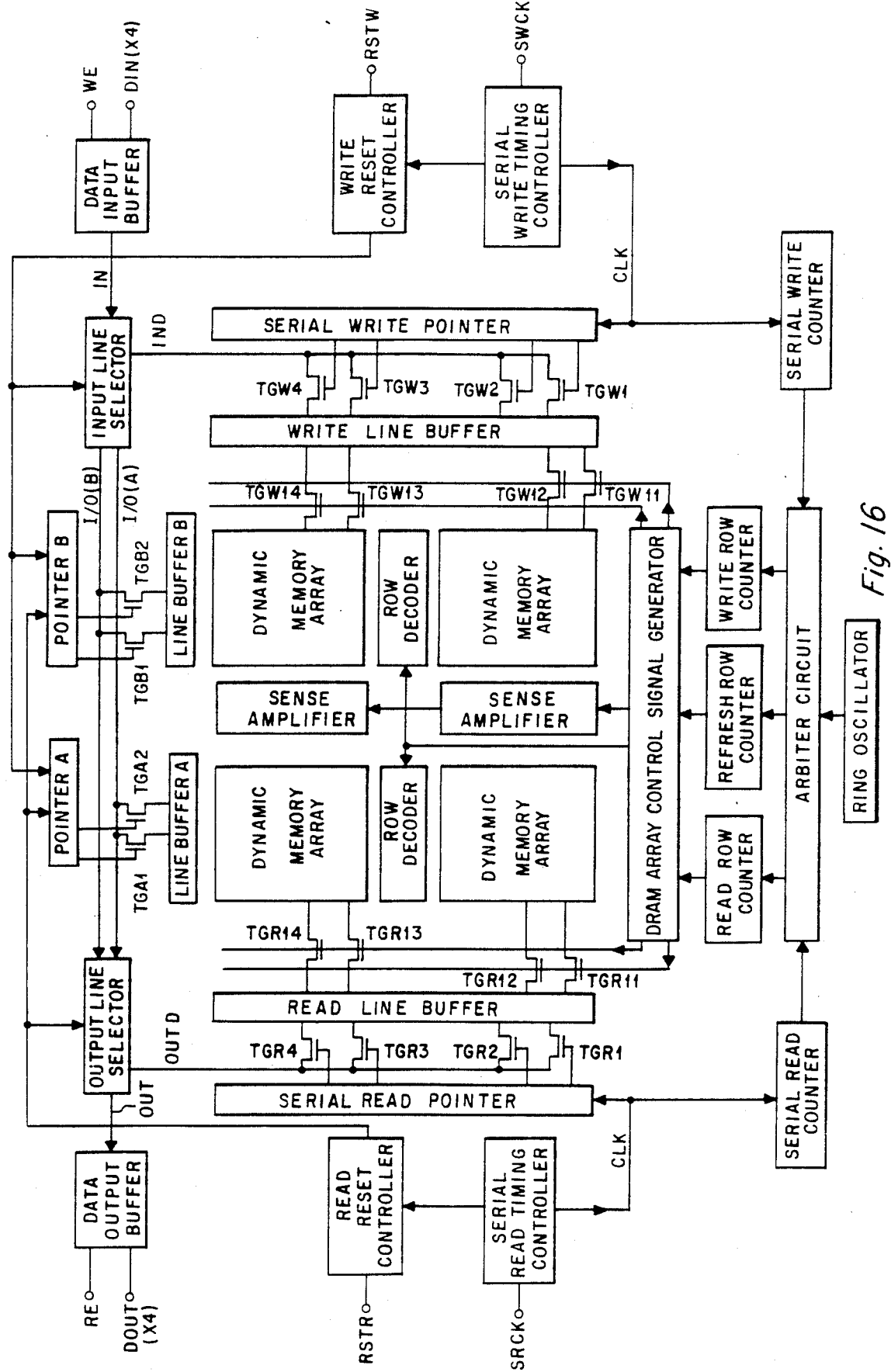
FIG. 16 is a block diagram illustrating the detailed circuitry of a large storage capacity memory device.

Subsequently will be described the flicker-free image creating circuit comprising a FIFO type memory, in particular the later-described FIFO memory device, as shown in FIG. 16, being used herein. The circuit is illustrated in FIG. 3 as block diagram, and the timing relation of input signals is diagrammed in FIG. 4. In FIG. 4, the symbol *1 represents the time duration of readout for the first line of information (A1 to A2) of field A at a speed twice that of the write speed into device 1; *2 represents the time duration of readout for the first line of information (B1 to B3) of field B at a speed twice that of the write speed into device 2; and *3 represents the time duration of readout for the second line of information (A3 to A5) of field A at a speed twice that of the write speed into device 1.

Transmitted data of "A" fields (A1 to A11) from a TV station, is written into a FIFO memory device 1, and the succeeding data "B" field (B1 to B11) into FIFO memory device 2. The control of write can be accomplished by changing write enable "WE" signal as shown in FIG. 3. Data of "C" field (C1 to C11) is written in the device 1. Simultaneously read out the first line information (A1 to A2) at clock rate twice the write speed. Then the first line information (B1 to B3) of "B" field is read out. The subsequent reads are carried out alternately each succeeding line from the devices as A3, A4, A5, B4, B5, B6, ... Thus "C" field (C1 to C11) is written into the device 1 and at the same time are read out from devices 1 and 2 in the order of A1, A2, B1, B2, B3, A3, A4, A5, B4, B5, B6, ... A9, A10, A11, B10, B11. In the device 1 accomplishing simultaneously write/read, in particular of FIG. 16, "A" field information is read out while writing "C" field information as diagrammed in the chart of FIG. 4. The part defined with broken line in FIG. 3 is a circuit for creating the functional relation: $B2' = \alpha B2 + (1-\alpha)A1$, which is well-known and not necessary to be not described. The first or last in each line can be detected by counting clocks of SRCK and SWCK.

Figure 5:
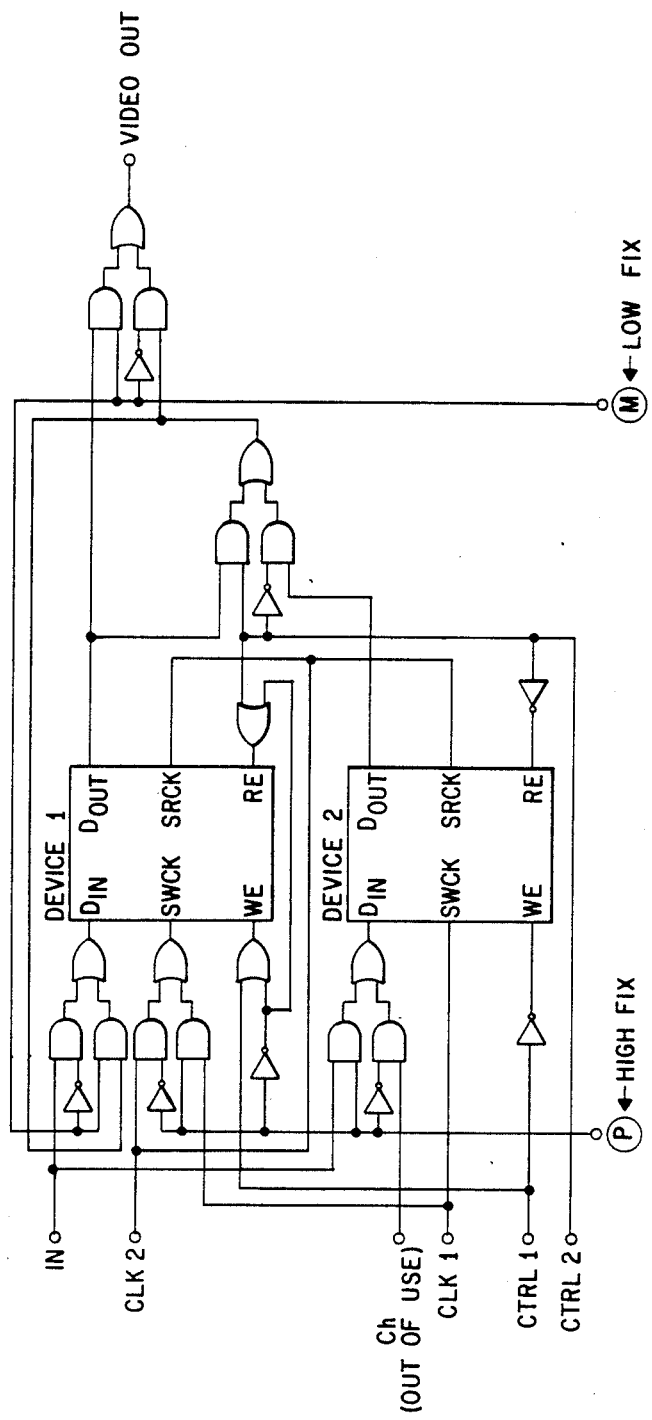
FIG. 5 is a block diagram illustrative of detailed circuitry of FIG. 3.

The detailed circuitry of FIG. 3 is realized as diagrammed in FIG. 5 by the fixation of mode selective signal Ⓟ to a higher level and Ⓜ to a low level.

Besides there may be additionally provided, if necessary, with a movement correcting circuit to be connected to the video Out.

(2) Realization of picture-in-picture mode

Figure 6:
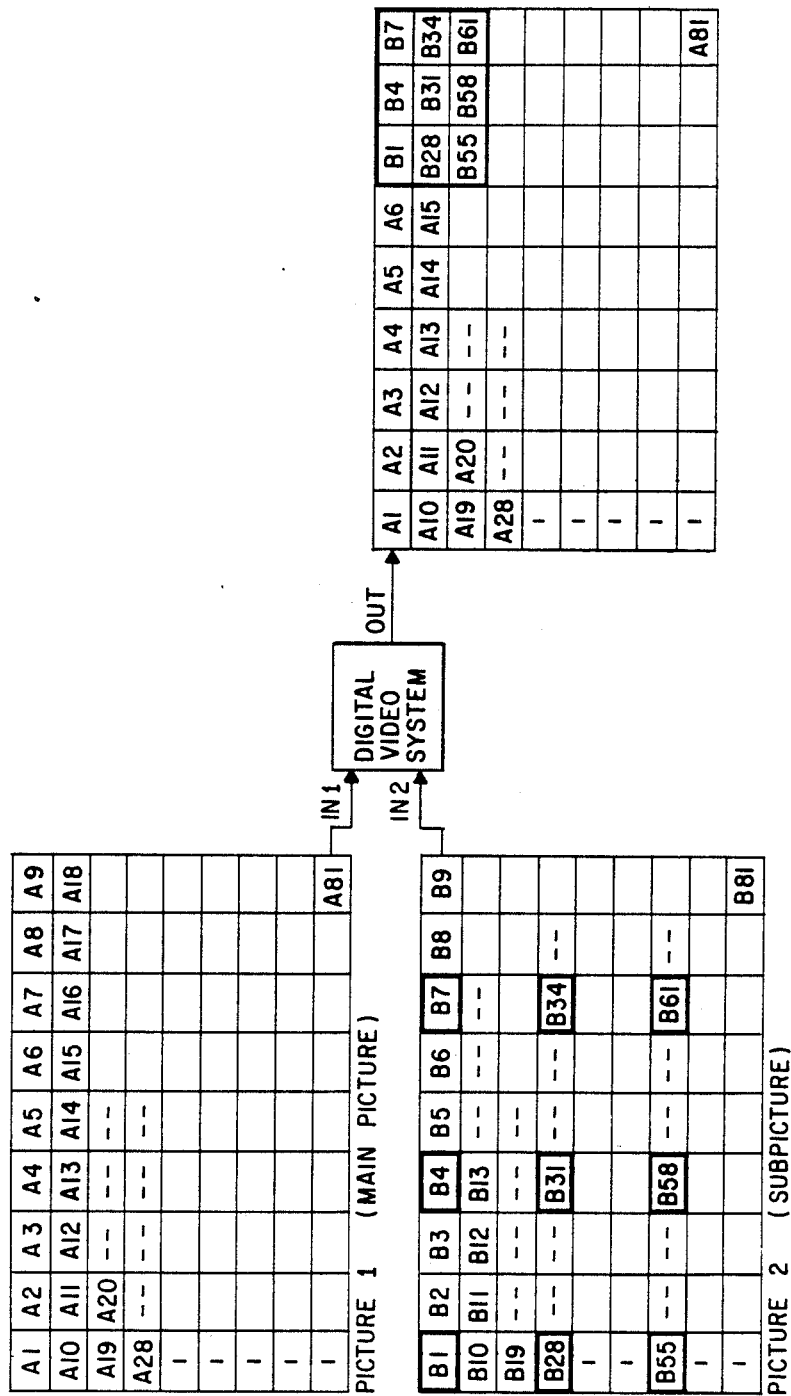
FIG. 6 is a schematic diagram illustrative of picture-in-picture mode.

FIG. 6 gives the conceptual illustration of this mode which is also well-known and its details therefore are omitted. It consists essentially of reducing the number of information bits necessary for a subpicture to be displayed and substituting the consequent compressed data for a part of the main picture data wherein the compressed data for the subpicture is enclosed within bold lines in the output.

Figure 7:
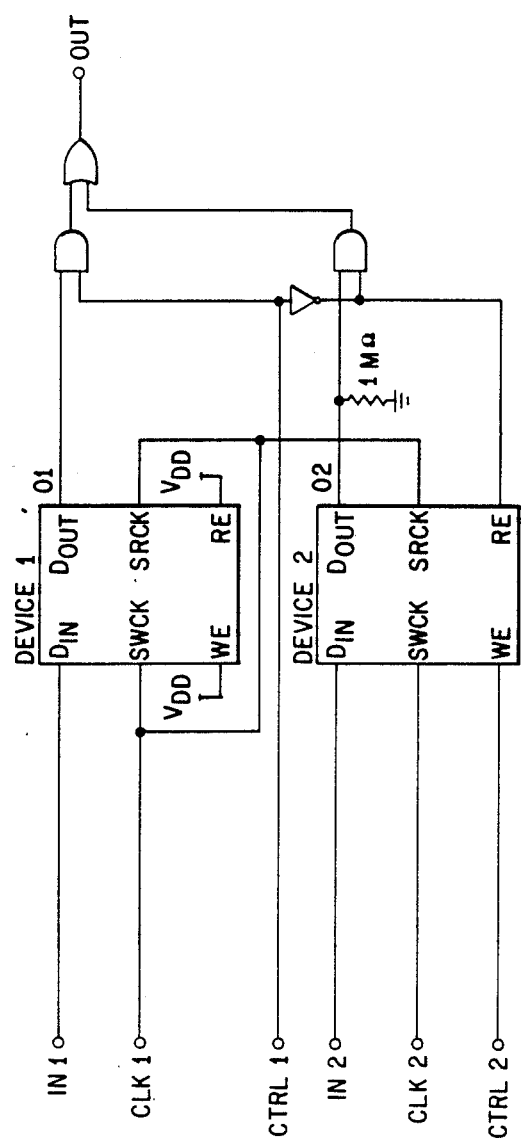
FIG. 7 is a block diagram of the circuitry permitting realization of picture-in-picture mode.

FIG. 7 shows a block diagram embodying the digital video system in FIG. 6 and FIG. 8 gives a timing chart of the same. Memory devices 1 and 2 are of main picture data and subpicture data, respectively.

Figure 8A:
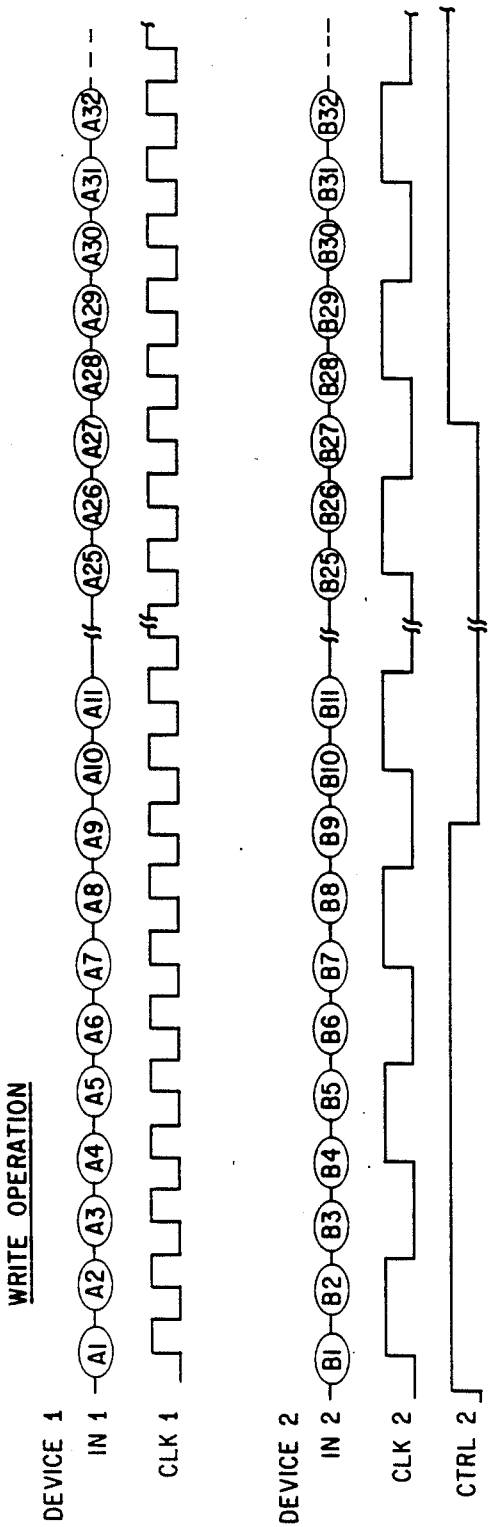
FIGS. 8A and 8B are timing charts of write/read of information to/from circuit of FIG. 7.
Figure 8B:
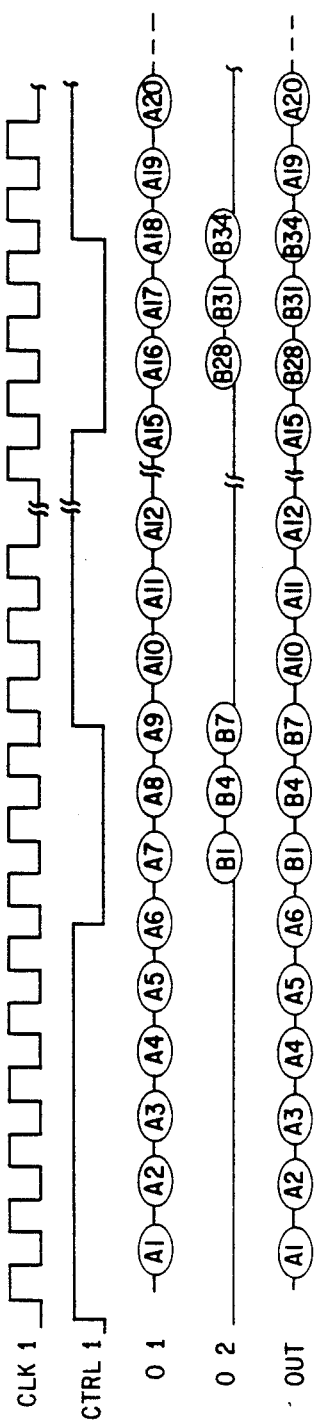

Referring to FIG. 6, for a 1/9 sized subpicture to be displayed, SWCK clock pulse width of Device 2 has 3 times that of Device 1, and WE signal is controlled as shown in FIG. 8A, thus only data enclosed with bold line in the picture 2 of FIG. 6 being written into Device 2. Reading data from there may be carried out as illustrated in FIG. 8B. In FIG. 6, the subpicture is positioned at the right top but can be inserted at any alternative position under control of read enable (RE) signal to Device 2 or by CTRL1 in FIG. 7. For example, main picture or subpicture which is moving can be displayed.

For selectively reading out $B_1$, $B_4$, $B_7$, ..., previously $B_1$, $B_4$, $B_7$, ... must be written by a serial write timing controller. In the later-described FIG. 16, data at $D_{IN}$ input terminal remains full ($B_1$, $B_2$ and $B_3$, . . .), and the compressed data ($B_1$, $B_4$ and $B_7$, . . .) is output from the data input buffer.

FIG. 8 shows timing relation between the subpicture data ($B_1$, $B_4$ and $B_7$, . . .) and the others. For example, the data is entered into the subpicture under timing when $CLK_2$ rises (0→1) at high $CLK_1$ level and at high $CTRL_2$ level.

In FIG. 6, $A_1$, $A_2$, . . . designate pixels including A/D converted and digitized data as of color, brightness or in combination of them. For instances, $A_1$ to $A_9$ represent one line and $A_1$ to $A_{81}$ corresponds to one field in FIG. 6, namely 81 pixels for simplified description whereas actual each field contains more pixels.

Figure 9:
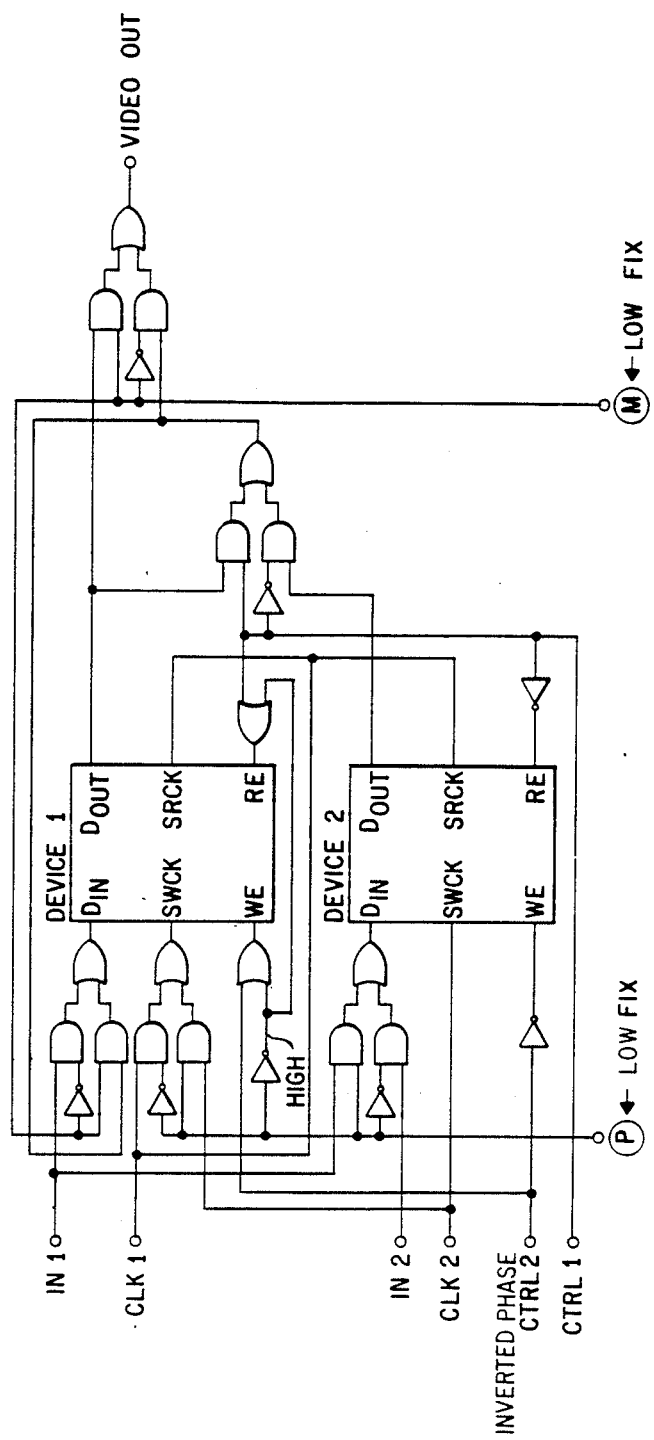
FIG. 9 is a block diagram illustrative of detailed circuitry of FIG. 7.

More detailed circuitry than that of FIG. 7 is shown in FIG. 9 by which mode selective signals Ⓟ and Ⓜ are both fixed at low levels. That in FIG. 9 is substantially the same as in FIG. 7 though it needs inverted signal of that given by the CTRL2 in FIG. 7.

In addition, WE and RE of Device 1 shown in FIG. 7 are at all times given high levels, whereas in FIG. 9, the same effect is obtained by the fixation of Ⓟ at a low level.

(3) Realization of teletext mode

Recently has been developed a television set having as well as usual function of reproducing TV video signals, function of receiving data-compressed character information and processing them into video image by a built-in dedicated controller to be displayed in the form of characters directly readable. Usually data correspondent to information of several tens pages is repeatedly transmitted per channel, and the data correspondent to an intended page of them is captured and displayed in the form of bit pattern through the controller. the transmission capacity of such data per channel is expected to increase from several tens pages at present to about 1000 pages in the near future.

Figure 10:
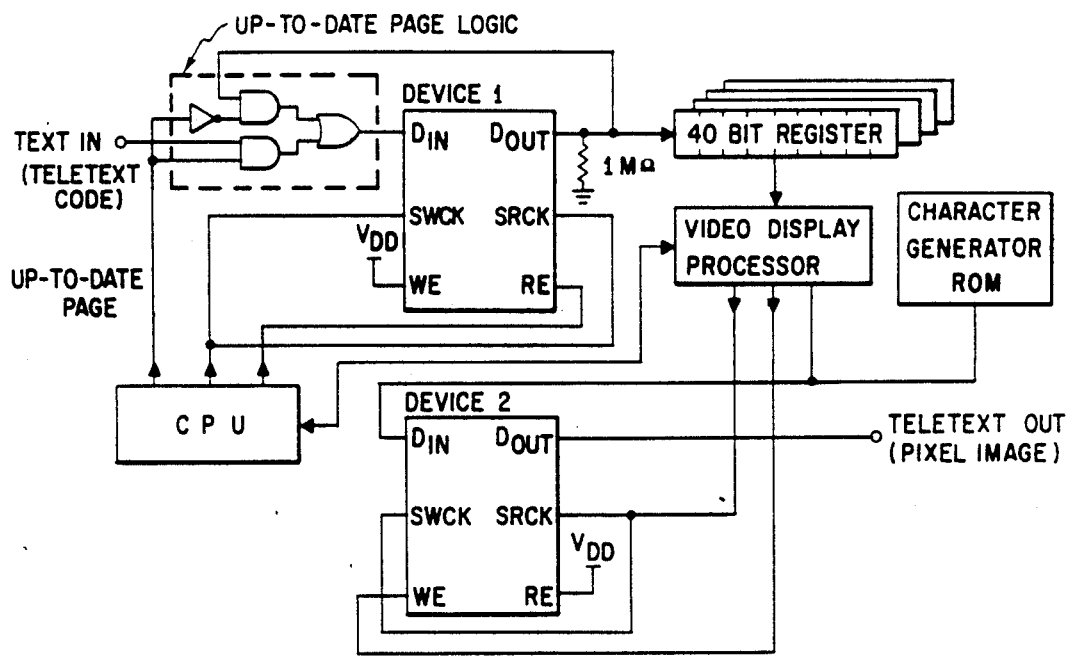
FIG. 10 is a block diagram of circuit permitting realization of the teletext mode.

Development like this will require to take countermeasure for reducing access time, otherwise too long time would be taken, for an intended page from a large amount of compressed data as much as 1000 pages written in the memory. For this purpose is useful the FIFO memory device 1 in FIG. 10. The number of such memories may be increased as desired, necessarily with attachment of an address to each memory, for example, to be classified into chapters corresponding to pages. Thus reading out of an intended page could be accessed after 256K words even at most, on the assumption of conducting memory procedure as shown in FIG. 16.). It will take 1/100 second only to access the 256 Kth word, and thus the requirement would be satisfactorily fulfilled with not RAM device but FIFO device. FIFO memory usually is difficult to overwrite only data of a specified portion. As illustrated in FIG. 10, however, the portion unnecessary to be overwritten is read out from Device 1, and rewritten as input data into the same device. On the other hand, at a specified address, the corresponding external data "In" is written into Device 1 under the control of CPU, thus only the specified address portion data can be overwritten. Device 2 is used to store data becoming converted into bit pattern and as a field memory for repeatedly displaying them, thus the data of any intended page being possible to be output from Device 2 and displayed.

(4) Realization of multi-picture mode

Figure 14:
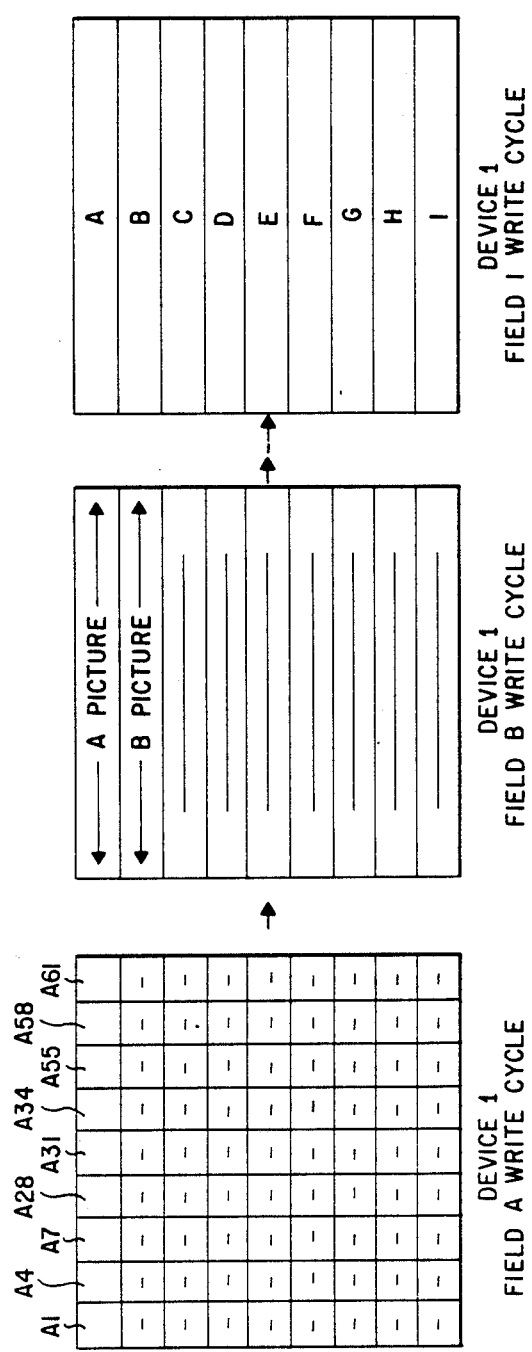
FIG. 14 is a schematic diagram of the multi-picture mode.
Figure 14:
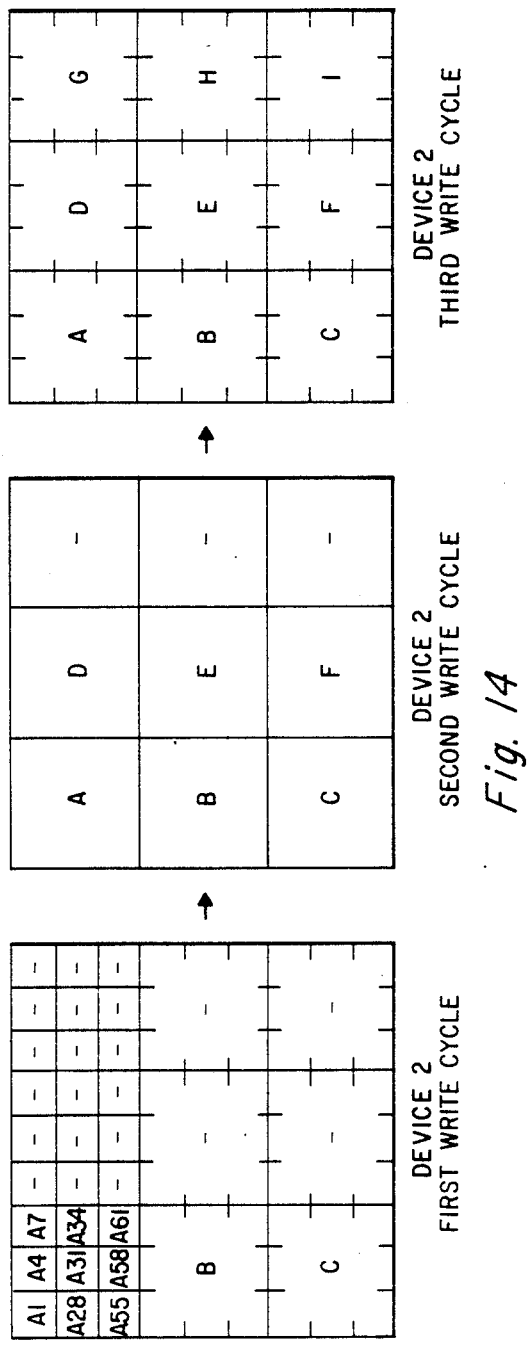

One example of this mode realized with two large storage capacity FIFO memory devices is diagrammed in FIG. 14 in which 9 or more (or may be fewer) different pictures are displayed on a video screen.

Figure 11:
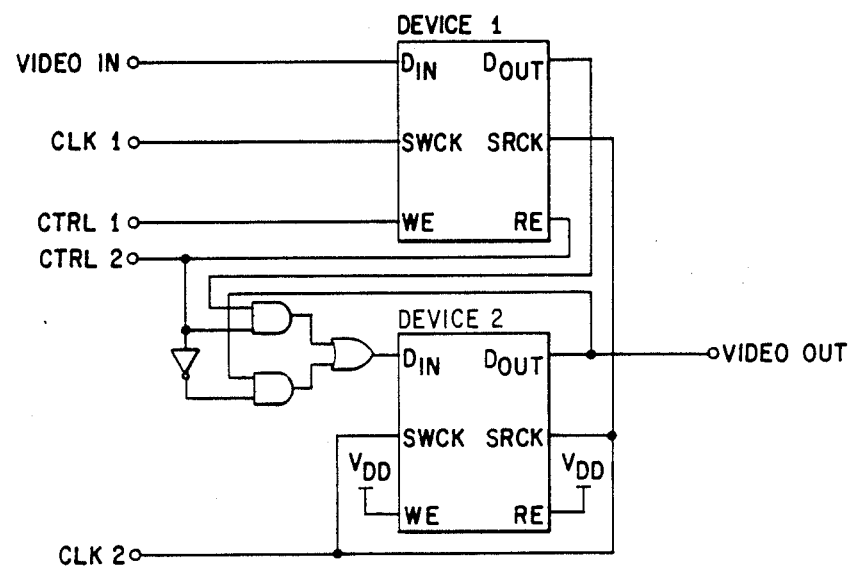
FIG. 11 is a block diagram of a circuit permitting multi-picture mode or stroboscopic mode.
Figure 12:
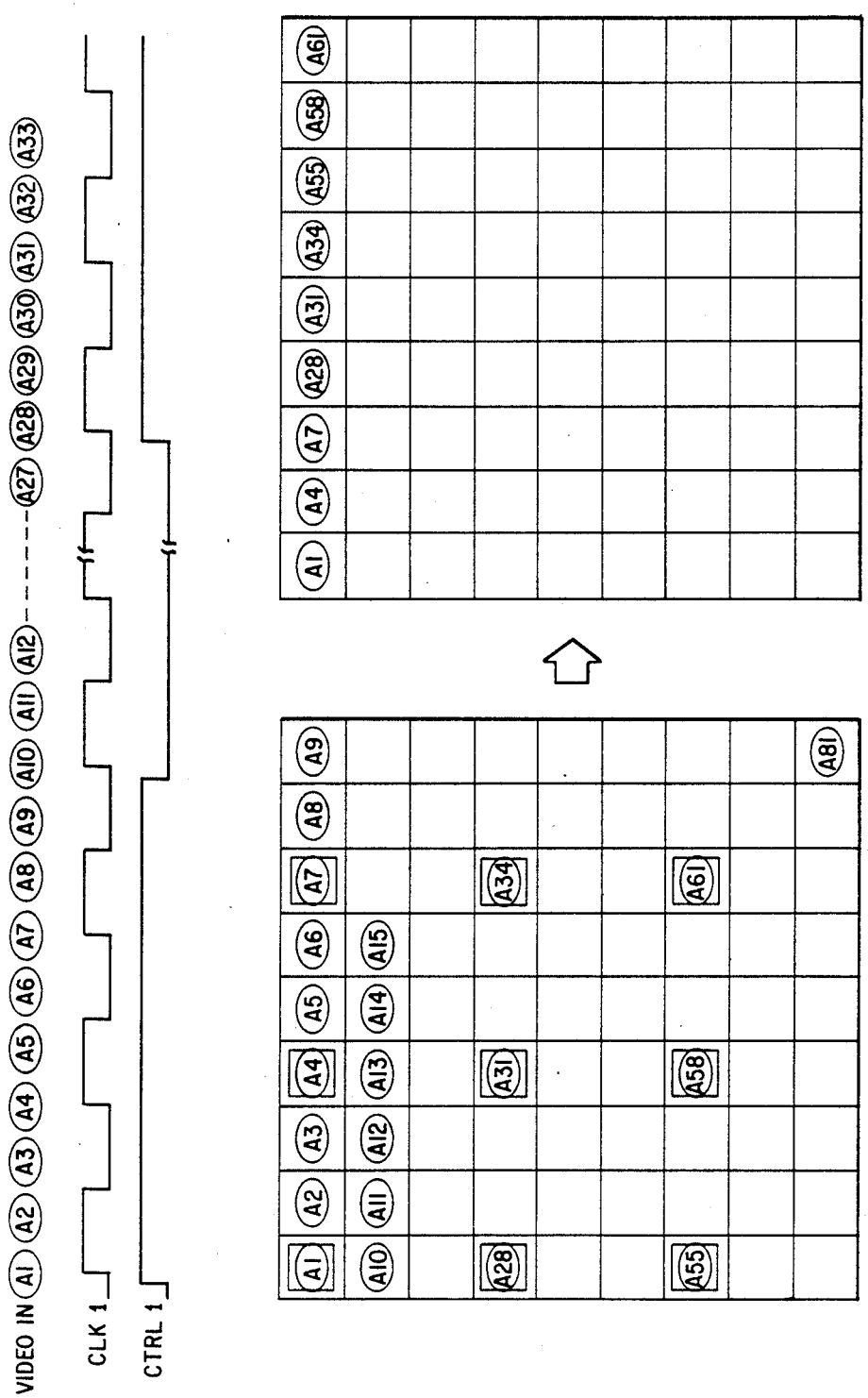
FIGS. 12 and 13 are timing charts illustrative of the multi-picture mode.
Figure 13:
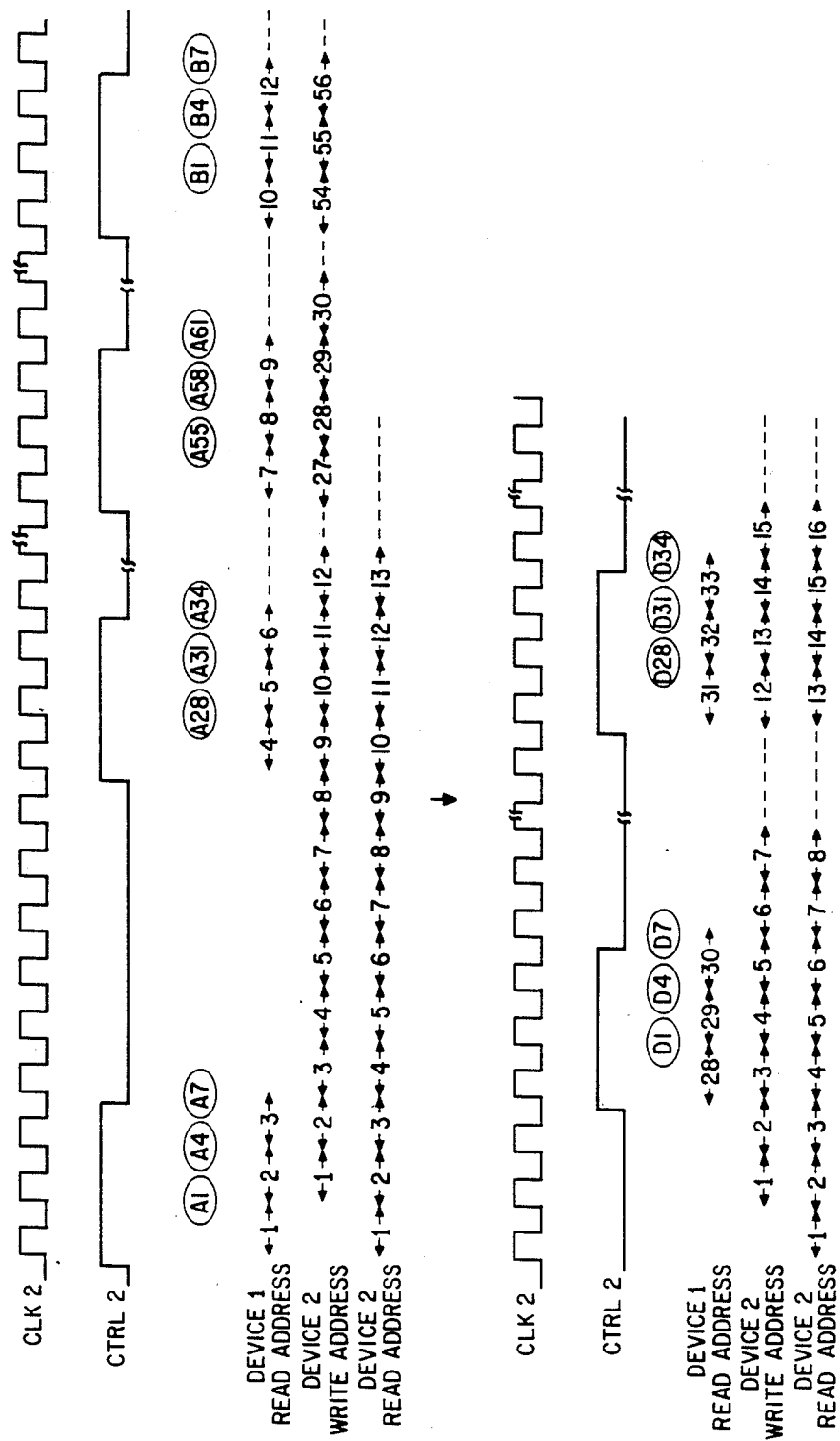

The circuitry for this example is illustrated in FIG. 11 and the control signal timing charts are shown in FIGS. 12 and 13. FIG. 12 is also useful for understanding the above-stated technique for storing in compressed form data transmitted from broadcasting station or other signal sources shown schematically in the left-hand matrix to the memory storage of device 1 shown schematically in the right-hand matrix.

As illustrated in FIG. 14, necessary image data may be written serially.

The thus-written data is read out under timing diagrammed in FIG. 13 and then written in Device 2 to rearrange in the order as possible to be displayed as picture.

As video In, datas of different channel can be sequentially written to create a multi-picture.

For example, 9 still subpictures can be displayed on a video screen.

In the following will be in a little more detail described the timing that in FIG. 14, image data written in the same order as in Device 1 is rearranged in the order appropriate for display and stored in Device 2.

Referring to FIG. 14, assuming that image data of A through I become input in Device 1, firstly subpictures of A, B and C are rearranged as shown on the left bottom, this timing being given in FIG. 13.

The A, B and C written like this are, during the subsequent cycle, firstly read from Device 2 through the intermediation of the feedback circuit and rewritten into Device 2, and at the write address of Device 2 where D, E and F is to be written, the feedback circuit is turned off, thus the data from the Device 1 (D, E and F) being written sequentially under timing shown in FIG. 13.

In further next cycle, readout is carried out at the positions of A, B, C, D, E and F from the Device 2 through the feedback circuit and rewrite at the same positions.

At positions where G, H and I are captured, the feedback circuit is turned off, and then data from the Device 1 is written in the same procedure as in the preceding cycle.

Figure 15:
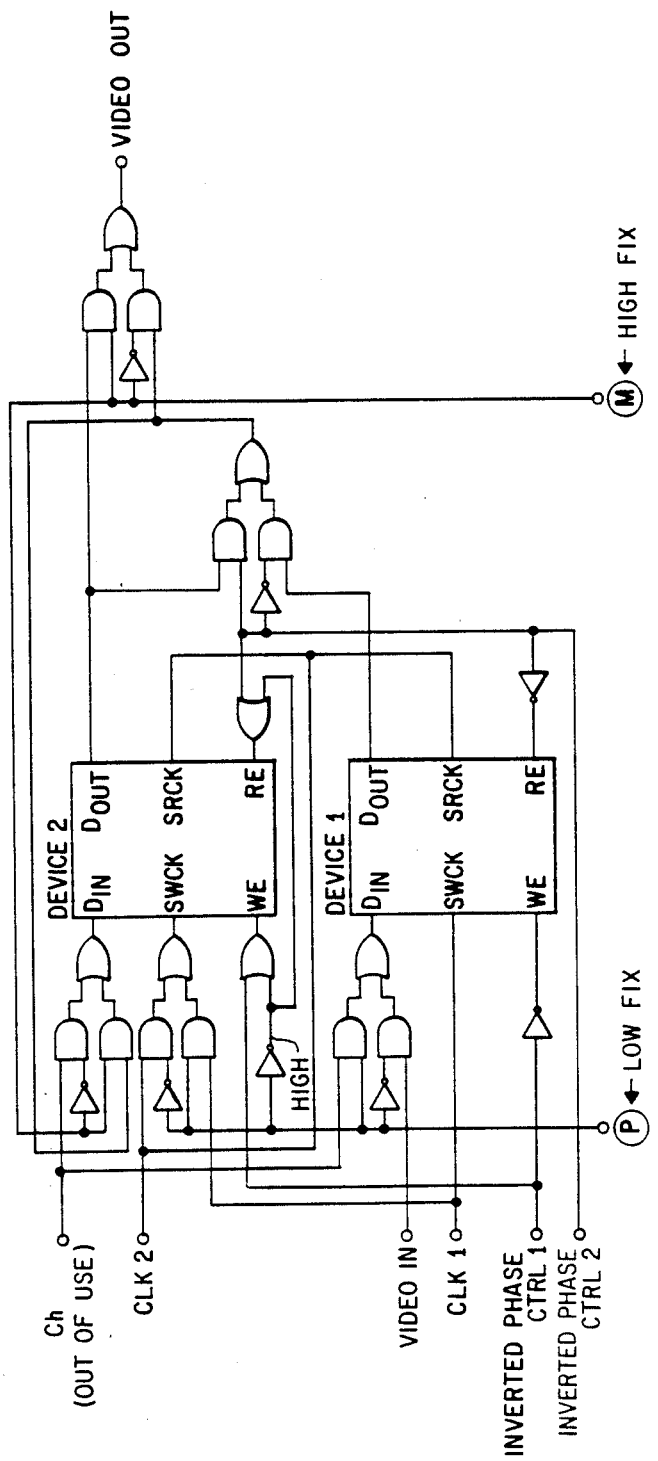
FIG. 15 is a block diagram illustrating the detailed circuitry of FIG. 11.

More detailed circuit of the multi-picture mode than that of FIG. 11 is diagrammed in FIG. 15 in which Ⓟ and Ⓜ are fixed to low and high levels, respectively.

(5) Stroboscopic mode

This mode is realized by that under the preceding (4), receiving as Video "In" is made only through the same channel, and datas of images at time intervals are sequentially written into the Device 1.

(6) Still mode

This mode can be realized with the same circuit as that of FIG. 5, except that signals of CLK1, CLK2, CTRL1 and CTRL2 are different, as CTRL2 is fixed to high level, and only Device 1 is as a rule used.

First of all, CTRL1 is changed into the high level, the data of a still image to be displayed is captured at usual period, CLK2, and upon completing the capture of all data, CTRL1 is changed to the low level to prevent the subsequently transmitted data from being captured. The captured data is repeatedly read out at usual period (CLK2) to display as still images.

These modes above-stated can be at will realized with with a single integrated-circuit system board, and the roles which the memory devices shall perform depend on a selected mode, for example, a memory used for subpicture in picture-in-picture mode is useful also as a buffer memory in another functional mode. Multiple purpose use of memories like this contributes to decrease in system cost.

Figure 17:
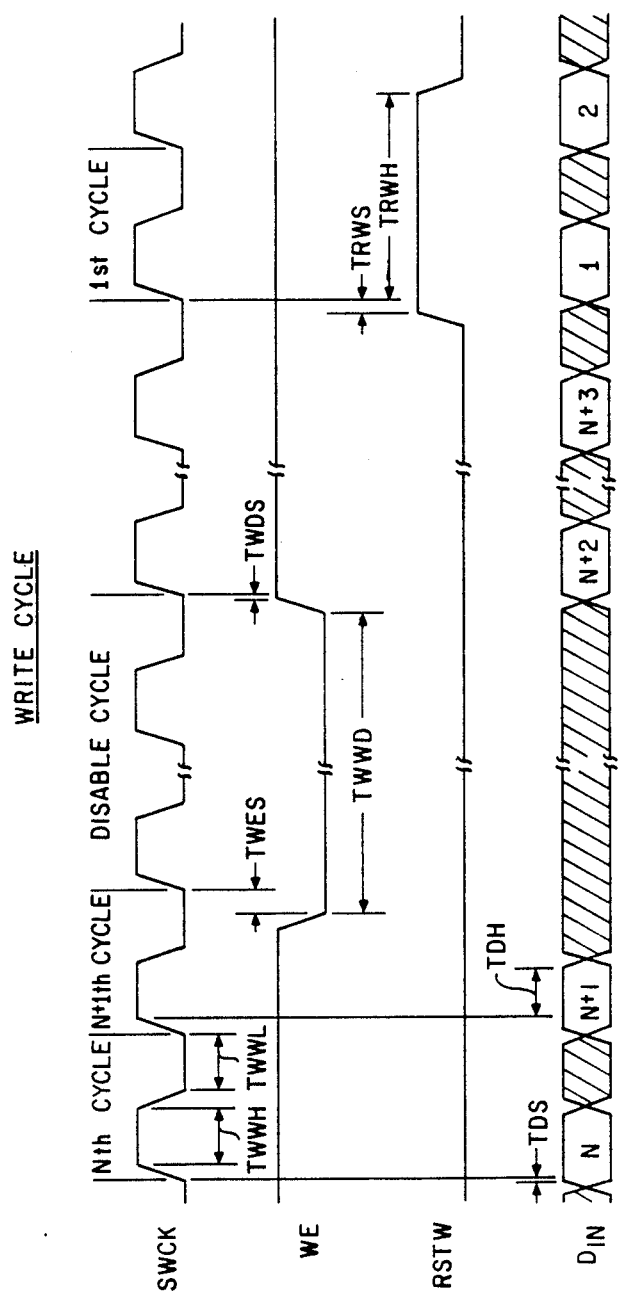
FIG. 17 is a timing chart write operation of the memory device of FIG. 16.

It will be described of the detailed circuitry of the devices 1 and 2 with reference to FIGS. 16 through 18 in the following:

In FIG. 16 is found a FIFO memory comprising dynamic type main memory elements, which has the following 6 important features:

(1) Like DRAM, as main memory elements are used the same unitransistor type memories, which is useful for large-scale integrated circuit and fabricated at comparatively low cost;

(2) An internal self-control circuit for refresh and precharge is provided whereas DRAM requires additional circuits for them which shall be user's burden.

(3) A dedicated write line buffer permitting data write speed to be set to cycle times within a wide range of low ($10^{-4}$ to $10^{-3}$ sec) to high ($30 \times 10^{-9}$ sec) is furnished;

(4) Another dedicated read line buffer permitting data readout within the same cycle time range as and asynchronously with the buffer under the preceding (3);

(5) A static line buffer is provided to allow faster response to a reset (to the first address of data) signal; and (6) An erronous bit correcting circuit is furnished to improve device productivity.

In the following the description will be given of the procedure of operation of the FIFO memory illustrated in FIG. 16, wherein data write and readout shall be carried out usually independently of each other unless otherwise specified.

Referring to FIG. 16, as long as the external input signal for controlling data write "WE" stays "H" level, input data through $D_{in}$ is written as effective data into the device. $D_{in}$ denotes data input terminal; RSTW, write reset signal with the rising edge defining the first address of data (See FIG. 17); and SWCK, data write cycle time regulating clock.

As long as RE, which denotes external input signal for controlling data output, keeps "H", data is read out from $D_{out}$ in synchronism with SRCK.

Figure 18:
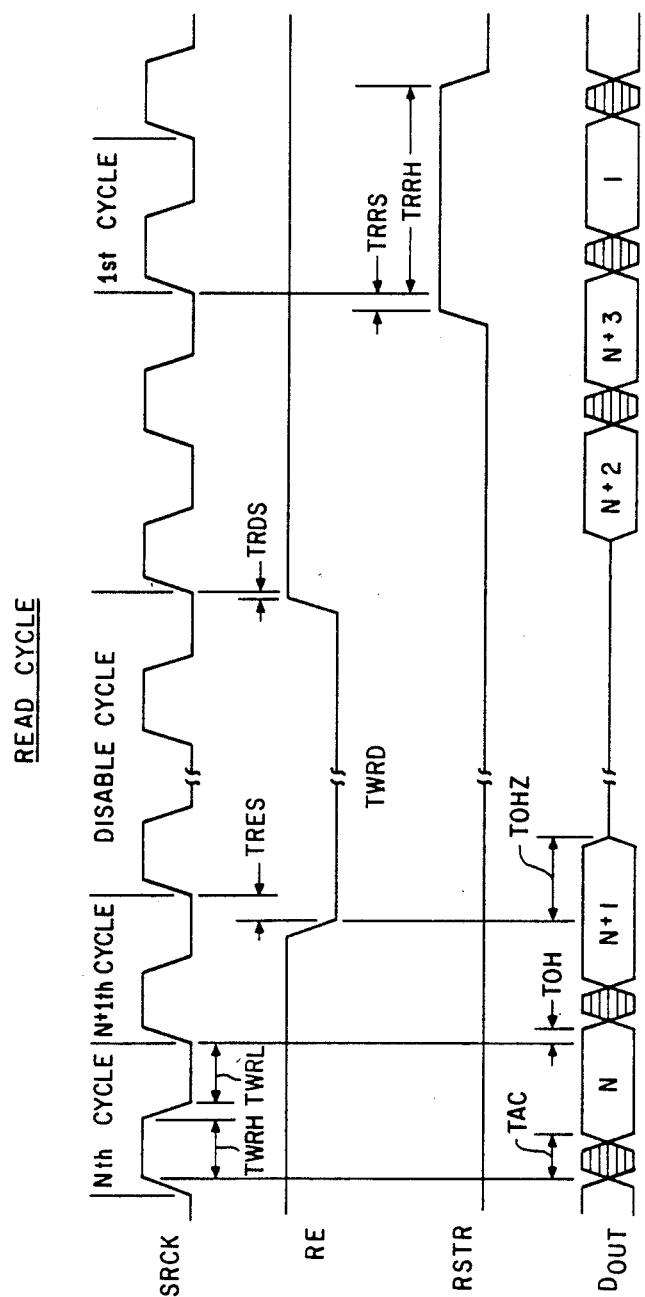
FIG. 18 is a timing chart during read operation of the memory device of FIG. 16.

RSTR denotes input signal with the rising edge defining the first address of data (See FIG. 18).

(1) When RSTW signal is caused to change from low to high, the data write address is reset to zero, and the device begins a set of operations: the concerned circuit detects the rising edge of RSTW and signaled to the input line selector, which then operates so that I/O(A) is connected to IN and I/O(B) and IND get disconnected from line IN. Simultaneously, data transfer gates $T_{GB1}$ and $T_{GB2}$ of the line buffer B are turned off the line I/O(B) and also data transfer gates $T_{GW1}$ to $T_{GW4}$ of the write line buffer are turned off the line IND. Thus the pointer B and serial line pointer become reset while the pointer A indicates the address O, that is, the data transfer gate $T_{GA1}$ now turns on. As the result, data transmitted from the data input buffer via the lines IN and I/N(A) to the line buffer A, and written at address O of it.

(2) In synchronism with SWCK clock, data is sequentially written successive address of line buffer A.

(3) As the line buffer A gets full with data written at all the available address thereof, a data transmission route switching request is sent from the pointer A to the input line selector, which changes the connection of the line I/O(A) from the line IN into the line IND.

(4) In synchronism with SWCK clock, the serial line pointer sequentially turns on data transfer gates $T_{GW1}$ through $T_{GW4}$ on the write line buffer so that input data from the $D_{IN}$ is written in the write line buffer.

(5) The moment the serial write pointer turns on the $T_{GW3}$, a write request signal "WRQ" is generated and transmitted to the arbiter circuit to write the data stored in the first half of the write line buffer into the dynamic memory array.

(6) Subsequently, by increment of the row decoder address one by one, serial write of data can continue until the maximum capacity of DRAM.

If generated in the course of this, another RSTW signal is likewise transmitted to the input line selector, but with the result of the connection of I/O(B) to the line IN and the turn-off of the lines I/O(A) and IND from the line IN. When the line buffer B thus gets full with data written at all the available addresses, like under the previous (3), the line I/O(B) is turned off the line IN, and the line IND is connected to the line IN, thus data write proceeding as mentioned above.

Upon input of the next RSTW signal, the line IN is connected to the line I/O(A). As understood from the above-stated, connection of the line I/O(A) or I/O(B) to the line IN is switched every input RSTW signal which acts as if a toggle switch.

Both line buffers A and B are composed of full-static memory elements, the reason for which will be given in the following description of the data read operation in which the construction is involved more deeply.

Data read operation

Data read operation will be described below:

(1) RSTR signal is changed from "low" to "high" to reset the data read address to zero inside the device. Internally, the edge of the RSTR signal is detected and signaled to the output line selector and arbiter circuit. Then the output line selector connects either the line I/O(A) or I/O(B) to the line OUT. When data is being written through one of them, connection to the other can be established. This means retrieval of readout of old data the time interval between RSTW and RSTR signals within a certain range, and, as mentioned later, useful for preventing conflict with the readout operation of data stored in the dynamic type main memory element portion. In the case where neither the line I/O(A) nor I/O(B) is connected to the line IN, one of these that has been used by the last RSTW signal is connected to the line OUT. This means readout of new data, that is, the same data will be always repeatedly read out until the next RSTW signal is generated. Owing to an external signal input from outside by the operator, generation of RSTR signal is out of the predictable range. For quick response to RSTR signal is suitable static memory which allows to read data fast, and is adopted for the line buffers A and B in the present example. Though the static type memory design lowers the degree of circuit integration, it gives a negligibly small effect on the total dimensions of the device, taking into consideration that the line buffers A and B may have a memory capacity of around 100 bits.

On the other hand, RSTR signal transmitted to the arbiter circuit generates a read request signal RRQ, in response to the signal, necessary data being read out from the dynamic memory array into the read line buffer within a necessary time interval, thereby the readout of these data can follow the current readout, just after completion of it, of all the data from the line buffer A and B.

(2) In synchronism with the clock SRCK from the line buffer A or B, data is serially read out until the last address of it.

(3) A data transmission route switch request is then transmitted from the pointer A or B to the output line selector to connect the line OUTD to the line OUT.

(4) since the first half of the read line buffer has been loaded with data to be read out already at the step (1), data is now continuously read out through the line OUT without any interruption. The moment the read pointer turns on the $T_{GR1}$, another read request RRQ is generated and applied to the arbiter circuit to read necessary data from the dynamic memory array to the second half of read line buffer.

It is noted that the same serial data may be read out every input of the signal RSTR.

The description of the basic operation has been now completed.

With an ideal FIFO memory, data read and write could have been completely asynchronously. Owing to the limited memory capacity associated with the actual device, however data read and write cannot carried out without any restriction.

For easier understanding of the read and write video data with FIFO memory device according to the invention, an explanation will be given by way of an example. It is herein assumed that this memory device has a memory capacity corresponding to a frame of video data (In Japan is adopted the NTSC system that a frame of video screen image is composed of 525 scanning lines).

As a frame of video data is sequentially written from the first to the last data thereof, the above memory device gets full. If further video data is input serially to the device, overwrite is carried out successively from the top address to create the second frame. Of course, if the WE signal is set to low to prohibit data write of the second and subsequent frames, the first frame of video data is kept stored and the same data can be read out repeatedly in the same data read procedure.

The above-explained circuit configuration of FIG. 16 may be modified very readily, for example, so that when the memory gets full, an internal signal can be generated for noticing the operator of it, or so that the same internal state as at low level of signal WE may be created, thereby overwrite can be prevented.

With the configuration of FIG. 16, in the case data is written continuously as mentioned above, either the preceding frame (old data) or the current frame (new data) that is being written can be read depending on the timing of the RSTR signal relative to the last RSTW signal. How this timing affects the above frame selection for data read is determined by the memory capacity of the line buffers A and B. For example, if a memory capacity of 100 bits is assumed for each of these line buffers, generation of a RRST signal within 100 SWCK clock cycles after the last WRST results in output of old data.

Generation of a RRST signal after more than 100 SWCK clock cycles following the last WRST signal does not always assure that new data will be retrieved. Alternative the time taken for data transfer from the write line buffer to the memory array and from the latter to the read line buffer is involved.

With the circuit configuration as described in detail and letting the memory capacities of the write and read line buffers be each 200 bits, new data will be read out under the following conditions:

Assuming that the first 100 bits of the new frame data are written in the line buffer A and the next 100 bits from 101th bit through 200th bit of the new frame data are written in the write line buffer at addresses 1 through 100. The moment the 201th bit is written at address 101 of the write line buffer, a write request WRQ is generated (as already mentioned). Since data transfer to the memory array has been always complete before the 301th bit is written, new data will be read satisfactorily if a read request RRQ for data transfer of 101th bit through 200th bit from the memory array to the read line buffer (resulting in input of a RRST signal as already mentioned) is generated when the 301th bit is written, or later.

Namely new data can be retrieved to be read out if a signal RRST is generated after more than 300 SWCK clock cycles following generation of the last WRST signal (when 300 bits of data have been written).

RRST signal should be not be generated within the range of 100 to 300 SWCK clock cycles after generation of the last RSTW signal because determination whether the old or new data shall be read is impossible in this time range.

Since data write and read can be asynchronously, the clock pulse widths of SWCK and SRCK can be changed freely, no confusion can occur mixing of old and new datas if the clocks SWCK and SRCK are set to such pulse widths that the request of $m-n \leq 100$ or $m-n \geq 300$ is always met, wherein m is the mph cycle of SWCK and n is the kth cycle of SRCK, taking the times of occurence of RSTW and RSTR as Othe cycles of SWCK and SRCK, respectively.

Besides the circuit of FIG. 16 comprises a DRAM (dynamic RAM) as a memory element and an internal circuit to refresh this memory element without control by any external signal. This will be explained below.

The basic design of the device is provided with line buffers for description of data, a ring oscillator, or the like, a counter for counting oscillation pulses from the oscillator, a mechanism for generate read and write request signals, a circuit for generating refresh request signals, and an arbit circuit for determining the priority sequence in which read, write and refresh signals are generated according to circumstances. The refresh process consists of dividing the oscillation frequency of the oscillator by a suitable counter and repeatedly generating RFRQ's at the proper period. Besides the refresh operation can be achieved not by the aid of external signal but by means of the internal circuits, thus without user's burden, and enabling data processing during refresh operation, this contributing to better efficiency of the memory device.

It will be evident that various modifications can be made to the described embodiments without departing from the scope of the present invention.

For example, the number of functional modes allowing to be operated is not always 6 but may be 2 or more. Modification may be made also of the circuitry of the device including the connection of the serial counters therein.

The invention, as described above, permits operations in a plurality functional modes to be accomplished with the same large capacity FIFO memory element, with the resultant advantage of realization of various system functions at high speed without needing direction of addresses.

What is claimed is:

1. A method for operating a video signal memory system in conjunction with a video image display device for producing a substantially flicker-free video image on the display device, said method comprising:

writing first field data into a first memory device having first in—first out data processing capability;

writing second field data into a second memory device having first in—first out data processing capability;

reading out the first line of said first field data from said first memory device while simultaneously writing third field data into said first memory device, wherein the readout clock rate of said first line of field data from said first memory device is at a speed twice that of the writing of said third field data into said first memory device;

reading out the first line of said second field data from said second memory device subsequent to the readout of said first line of said first field data from said first memory device but simultaneously with respect to the continued writing of said third field data into said first memory device and at a readout clock rate having a speed twice that of the writing of said third field data into said first memory device; and continuing the readout of respective lines of said first field data from said first memory device and said second field data from said second memory device in an alternating manner and simultaneous to the continued writing of said third field data into said first memory device at a readout clock rate having a speed twice that of the writing of said third field data into said first memory device until a complete frame of field data is produced as a video image for display on the display device.

2. A method as set forth in claim 1, further comprising:

reading out the first line of a second frame of field data as the first line of said third field data from said first memory device while simultaneously writing fourth field data into said second memory device, wherein the readout clock rate of said first line of said third field data from said first memory device is at a speed twice that of the writing of said fourth field data into said second memory device;

reading out the first line of said second field data from said second memory device subsequent to the readout of said first line of said third field data from said first memory device but simultaneously with respect to the continued writing of said fourth field data into said second memory device and at a readout clock rate having a speed twice that of the writing of said fourth field data into said second memory device;

continuing the readout of respective lines of said third field data from said first memory device and said second field data from said second memory device in an alternating manner and simultaneous to the continued writing of said fourth field data into said second memory device at a readout clock rate having a speed twice that of the writing of said fourth field data into said second memory device until the second complete frame of field data is produced; and continuing the sequence of field data writing and readout as between said first and second memory devices.

* * * * *